April 26, 1960 J. J. PAKAN 2,934,654

WAVEFORM GENERATOR

Filed April 11, 1957

INVENTOR,
JOHN J. PAKAN.

BY Harry M. Saragovitz

ATTORNEY.

United States Patent Office 2,934,654

Patented Apr. 26, 1960

2,934,654

WAVEFORM GENERATOR

John J. Pakan, Elmwood Park, Ill., assignor to the United States of America as represented by the Secretary of the Army Application April 11, 1957, Serial No. 652,325

2 Claims. (Cl. 250—233)

The present invention relates to a waveform generator and more particularly to a waveform generator having in combination therewith an RC integrating circuit which acts as an integrator and low pass filter.

The generation of electrical waveforms by other than purely electrical means frequently results in an unwanted generation of higher frequency components due to noise generation and/or pick up, mechanical imperfections in the generator, etc. The device disclosed herein reduces or eliminates high frequency noise and is applicable to waveforms whose differential can be easily generated. Instead of generating the desired waveform, a waveform is generated such that when integrated by an RC integrator network of a specified time constant, it will have a desired characteristic. The RC integrator network has a time constant of the order of the period of the generated wave, and attenuates as a low pass filter unwanted spurious signals composed of high frequencies. It should be noted that since the RC time constant is specified in terms of the period of the waveform, it must be reset if the waveform period is changed. This will be necessary so that the desired relationship between the generated and output waves will be preserved.

The RC integrator network, as disclosed herein, can be used to an advantage with a generator whose output is at a very low level and is subsequently amplified. The RC integrator network in such a case can be located at a much higher level stage, i.e., after most or all of the amplification has taken place. In this manner the pick-up, hum, and amplifier distortion will all be reduced by the low pass characteristic of the RC integrator network.

An object of the present invention is to provide a means for eliminating noise pulses produced in a waveform generator.

Another object of the present invention is to provide an integrator network in a waveform generator to reduce the noise generated therein.

A further object of the present invention is to provide an integrator network to reduce noise from a generator which generates electrical waveforms by other than purely electrical means.

Still another object of the present invention is to provide an RC integrator network to be utilized in a wave form generator wherein the RC integrator network has a time constant of the order of the period of the generated wave in order that the high frequency noise superimposed thereon will be removed by the low pass characteristics of the RC integrator network.

A still further object of the present invention, as used in a waveform generator, is the reduction of noise and spurious voltages which may be superimposed on a sweep generator waveform by light intensity variations on a phototube cathode or by dust on the edges of the tapered slot in a rotating sweep disc.

The exact nature of this invention as well as other objects and advantages thereof will be readily apparent from consideration of the following specification relating to the annexed drawings in which.

Figure 1:
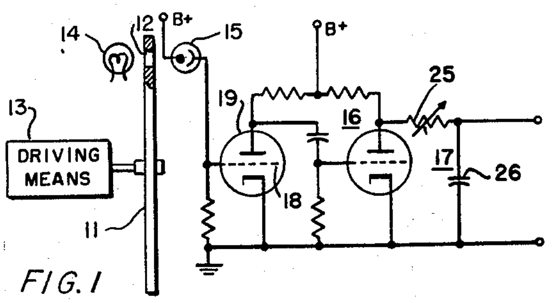
Figure 1 is a simplified schematic diagram of the present invention.

Referring now to the drawings, wherein like reference characters designated like or corresponding parts throughout the several views, there is shown in Fig. 1 a waveform generator comprising rotating sweep disc (control disc) 11 having tapered slot 12 therein; driving means 13 mechanically connected to and driving disc 11; lamp (light source) 14 and photocell (phototube) 15 associated with disc 11 so as to produce a waveform; two stage amplifier circuit 16 to amplify the produced waveform; and integrator network 17 connected to the output of two stage amplifier circuit 16 to integrate the output therefrom and to reduce any high frequency noise superimposed upon the produced waveform.

Figure 2:
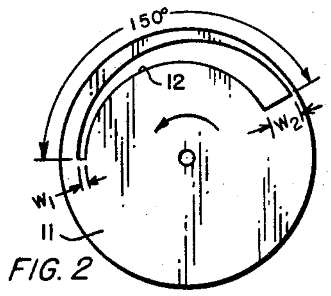
Figure 2 shows the structure of the control disc which may be used for generating a sweep voltage.

Tapered slot 12 of disc 11, as shown in Fig. 2, is adjacent to the periphery of disc 11, forms a sector of approximately 150°, and has a width increasing with the rotation of disc 11. The end portions of tapered slot 12 have width $W_1$ and $W_2$ respectively—$W_2$ being wider than $W_1$.

Disc 11, driven by driving means 13, rotates at a constant rate in the direction shown by the arrow in Fig. 2. Lamps 14 and photocell 15 are each fixedly positioned adjacent to disc 11 on opposite sides thereof so that tapered slot 12 passes between them as disc 11 rotates.

Light emanating from lamp 14 passes through tapered slot 12 of disc 11 and impinges upon photocell 15 when slot 12 is positioned between lamp 12 and photocell 15. As disc 11 rotates in the direction shown, the width of the tapered slot 12 increases, increasing the amount of light impinging on photocell 15 proportionally to the width of tapered slot 12. Photocell 15, activated to conduction by the light impinging thereon, allows a voltage to be applied to grid 18 of amplifier tube 19 of two stage amplifier circuit 16. This voltage increases proportionally to the conduction of photocell 15.

Figure 3:
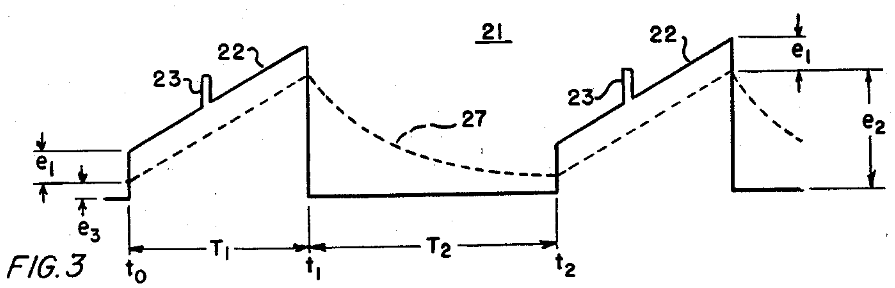
Figure 3 illustrates the sweep voltage waveform.

It should be noted that the linear sweep voltage waveform, designated by numeral 21 in Figure 3, illustrates both the input sweep voltage waveform to and the output sweep voltage waveform from two stage amplifier circuit 16. These two sweep voltage waveforms are identical except that the magnitude of the output sweep voltage waveform is greater than the magnitude of the input sweep voltage waveform.

In summation it can be said that linear sweep voltage waveform 21, as depicted in Fig. 3, will be applied to grid 18 of amplifier 19. Sweep voltage 22 of linear sweep voltage waveform 21 occurs only for the period of time in which the light from lamp 14 passes through tapered slot 12 of disc 11 and activates photocell 15 into conduction. When the light no longer passes through slot 12, sweep voltage 22 abruptly drops to zero. Thus sweep voltage 22 has a definite shape as determined by tapered slot 12 and the rotation of disc 11. Since disc 11 rotates at a constant rate, linear sweep voltage waveform 21 as depicted in Fig. 3 is developed.

The period of one cycle of sweep voltage waveform 21 is from $t_0$ to $t_2$, i.e., $T_1+T_2$, as shown in Fig. 3, and is determined by the rate of rotation of disc 11. Sweep voltage 22, as depicted in Fig. 3, occurs for the period $T_1$, i.e., $t_0$ to $t_1$, or for approximately half of the cycle of rotation of disc 11 and thereafter is blanked out during the period $T_2$, i.e., $t_1$ to $t_2$, or for the rest of rotation cycle of disc 11.

The generation of linear sweep voltage waveform 21 in the manner described above results in the generation of an unwanted higher frequency noise. This high frequency noise is illustratively shown as a single spike 23 in Fig. 3 and is superimposed upon sweep voltage 22 of linear sweep voltage waveform 21.

To eliminate this high frequency noise and at the same time to derive the desired sweep voltage waveform, output sweep voltage waveform 21 of two stage amplifier circuit 16 is applied to integrator network 17. This integrator network 17, as shown in Fig. 1, comprises resistor 25 and capacitor 26. Resistor 25 and capacitor 26 are chosen so that they will have a time constant of the order of the period of the generated wave and will attenuate as a low pass filter an unwanted spurious signal composed of higher frequencies. Thus, across capacitor 26 there is derived sweep voltage waveform 27, as shown by the dashed lines in Fig. 3 having the desired sweep voltage waveform and being free of any high frequency noise, i.e., linear sweep voltage waveform 21, is modified by an "integration" action which removes the front step of the wave while maintaining the linearity of the sweep portion and changes the back step to a decaying exponential.

In Fig. 2 the end widths $W_1$ and $W_2$ of the 150° tapered slot 12 of rotating disc 11 are physically fixed. Thus from Figs. 2 and 3 it can be seen that:

$$\frac{W_1}{W_2}=\frac{e_1+e_3}{e_1+e_2}$$

and since $e_1>e_3$ (Eq. 1) $$\frac{W_1}{W_2}\alpha\frac{e_1}{e_1+e_2}$$

The symbol "α" used in Eq. 1 above and in the equations to follow means "proportional to."

Since the linearity over sweep portion $T_1$ is to be preserved in the output voltage waveform, the output capacitor (C) 26 must be charged at a uniform rate, i.e., the current (I) through resistor (R) 25 must be constant during $T_1$. Equations formulated on this premise may be solved as follows:

During period $T_1$:

$$e_1=IR$$

(General equation) $$V=\frac{1}{c}\int_{t_0}^{t} Idt+e_3$$

At $t_1$:

$$e_2=\frac{1}{c}\int_{t_0}^{t} Idt+e_3=\frac{1}{c}\int_{t_0}^{t_1}\frac{e_1}{R}dt+e_3$$

$$e_2=\frac{e_1}{RC}T_1+e_3$$

(Eq. 2) $$\frac{e_2}{e_1}=\frac{T_1}{RC}+\frac{e_3}{e_1}$$

At the end of period $T_2$:

$$e_3=e_2\epsilon^{\frac{-(t_2-t_1)}{RC}}$$

(Eq. 3) $$e_3=e_2\epsilon^{\frac{-T_2}{RC}}$$

Substituting Eq. 3 in Eq. 2:

$$\frac{e_2}{e_1}=\left(\frac{1}{1-\epsilon^{\frac{-T_2}{RC}}}\right)\left(\frac{T_1}{RC}\right)$$

(Eq. 4) $$RC\left(1-\epsilon^{\frac{-T_2}{RC}}\right)=\frac{e_1}{e_2}T_1$$

Since:

$T_2>T_1$ by design, $RC<T_1$ because $e_1<e_2$, and it is desirable to make $$\epsilon^{\frac{-T_2}{RC}}\ll 1$$

Hence:

$$RC\alpha\frac{e_1}{e_2}T_1$$

Further, when solving for $$\frac{e_1}{e_2}$$

from Eq. 1:

$$\frac{W_1}{W_2}\alpha\frac{e_1}{e_1+e_2}$$

$$e_1W_2\alpha e_1W_1+e_2W_2$$

$$e_1(W_2-W_1)\alpha e_2W_2$$

(Eq. 5) $$\frac{e_1}{e_2}\alpha\frac{W_2}{W_2-W_1}$$

and thus by identity and using a value of 0.0138 second for $T_1$:

$$RC\alpha\frac{e_1}{e_2}T_1\alpha\frac{W_1}{W_2-W_1}\ (0.0138)\ \text{second}$$

The nearly exact value of RC may be determined from a few successive approximations to a very good accuracy. In practice R is a variable resistor which is adjusted while observing the linearity of the sweep voltage waveform.

Figure 4:
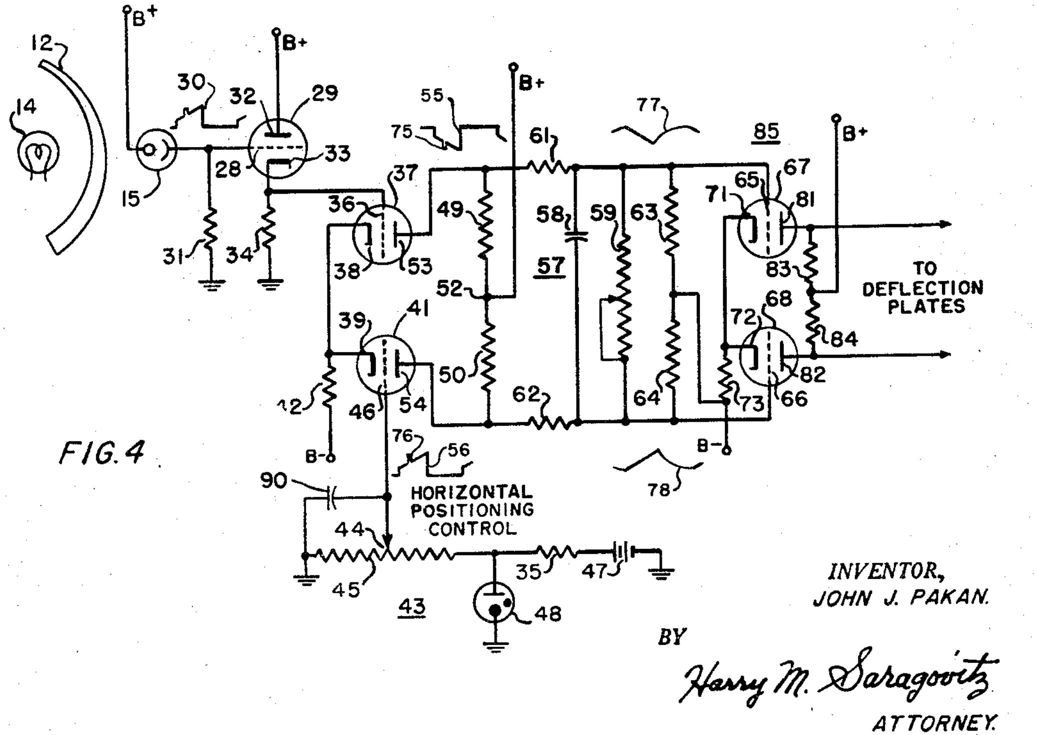
Figure 4 is a schematic drawing of the preferred embodiment of the invention.

The electrical circuit as shown in the schematic diagram depicted in Fig. 4 supplies a sweep voltage waveform to deflection plates of a C.R.T. and illustrates a preferred embodiment of the present invention. Light emitted by lamp 14 passes through slot 12 and actuates photocell 15 into conduction. During conduction, photocell 15, electrically connected between B+ and grid 28 of cathode follower tube 29, allows sweep voltage 30 to be applied to grid 28. Grid resistor 31 is connected between grid 28 and ground. Plate 32 and cathode 33 of cathode follower tube 29 are connected to B+ and an end of cathode resistor 34 respectively, cathode resistor 34 having its other end connected to ground. Cathode 33 is further connected to grid 36 of direct coupled amplifier 37.

Cathode 38 of direct coupled amplifier 37 is connected to cathode 39 of cathode coupled phase inverter tube 41. Between the junction of cathodes 38 and 39 and B— is connected cathode resistor 42. Grid 46 of tube 41 is grounded through condenser 90 for A.C.

A horizontal positioning network 43, used for changing the horizontal position of the display on a C.R.T., is connected by variable arm 44 of horizontal positioning potentiometer 45 to grid 46 of cathode coupled phase inverter tube 41. An unregulated D.C. source of voltage 47 is connected through a series resistor 35 between one fixed terminal of horizontal positioning potentiometer 45 and ground; and a neon tube 48, used to provide regulation in the circuit, is connected between the same fixed terminal of horizontal positioning potentiometer 45 and ground. The other fixed terminal of horizontal positioning potentiometer 45 is connected to ground.

Plate resistors 49 and 50 have a common terminal 52 connected to B+ and are connected to plates 53 and 54 respectively of direct coupled amplifier 37 and cathode coupled phase inverter 41 respectively. The outputs of direct coupled amplifier 37 and cathode coupled phase inverter 41, appearing on plates 53 and 54 respectively, are depicted as sweep voltages 55 and 56 respectively. Sweep voltages 55 and 56 are 180° out of phase and are negative going and positive going respectively.

An integrator circuit 57, comprising capacitor 58 and variable potentiometer 59 connected in parallel, resistor 61 connected between one end of the parallel combination of capacitor 58 and variable potentiometer 59 and plate 53 of direct coupled amplifier 37, and resistor 62 connected between the other end of the parallel combination of capacitor 58 and variable potentiometer 59 and plate 54 of cathode coupled phase inverter 41, acts both as a low pass filter and as an integrator network. Resistors 61 and 62, acting as part of the integrating circuit, primarily function as decoupling resistors.

Also connected in parallel with capacitor 58 and variable potentiometer 59 is a series combination of resistors 63 and 64 having their junction connected to B−. The extremities of resistors 63 and 64 are connected to grids 65 and 66, respectively, of tubes 67 and 68, respectively. Resistors 63 and 64 are merely grid return resistors. Parallel cathodes 71 and 72 of tubes 67 and 68, respectively, are connected through series cathode resistor 73 to B−.

Sweep voltages 55 and 56, having superimposed thereon noise pulses 75 and 76 respectively, appear at grids 65 and 66 respectively as integrated sweep voltages 77 and 78 respectively. Since integrator circuit 57 behaves as a low pass filter as well as an integrating network, the noise pulses 75 and 76 are attenuated, and integrated sweep voltages 77 and 78 are substantially linear and free of noise.

Plates 81 and 82 of tubes 67 and 68, respectively, are connected to series plate load resistors 83 and 84, respectively, and to the horizontal plates of a C.R.T. The junction of series resistors 83 and 84 is connected to B+. Tubes 67 and 68 in conjunction with their related circuitry function as a conventional direct coupled push-pull type amplifier 85.

It should be understood from the disclosure above that the use of dual triodes in place of tubes 37, 41 and 67, 68 will in no way hamper the operation of the disclosed circuit.

In summation it can be said that light emanating from lamp 14 and impinging on photocell 15 as it passes through slot 12 actuates photocell 15 into conduction allowing a sweep voltage determined by the shape of the slot 12 and rotation of the disc 11 to be applied to a grid of a tube. Sweep voltages generated in this manner have superimposed thereon high frequency noise. Thus to eliminate this high frequency noise and still obtain the desired sweep voltage waveform, a waveform is generated such that when integrated by an RC integration network the desired waveform would be obtained. This is accomplished by the choice of the design of slot 12 and speed of rotation of disc 11. Amplifier circuits increase the amplitude of the sweep voltage waveform, and the RC integrator network integrates the output from a stage of the amplifier circuit. This integrator also acts as a low pass filter attenuating the high frequency noise. Thus the sweep voltage waveform at the output of the integrator network will have the desired waveshape and will have little or no high frequency noise superimposed thereon.

It should be understood, of course, that the foregoing disclosure relates to only a preferred embodiment of the invention and that numerous modifications or alterations may be made therein without departing from the spirit and scope of the invention as set forth in the appended claims.

What is claimed is:

1. A sweep voltage generator, for generating continuously repeated linear saw-tooth waves, comprising a disk having a tapered arcuate slot therein, said slot increasing from a width $W_1$ to a width $W_2$, means to rotate the disk at a constant speed, a light source and a photocell arranged on opposite sides of said disk such that said slot will control the transmission of light from said source to said photocell during a period $T_1$, amplifying means having an input coupled to said photocell, and an RC integrating network shunting said amplifying means, said integrating network comprising resistance means R and a capacitor C in series, with the output from the integrating network being taken across the capacitor, the time constant of the integrating network being related to the period $T_1$ by the relationship:

$$RC \alpha \frac{W_1}{W_2 - W_1} T_1$$

2. The sweep-voltage generator of claim 1, in which said amplifying means includes two cascaded pairs of electron discharge tubes, with the tubes of each pair in push-pull, each of said electron discharge tubes including a grid and a plate, said resistance means comprising resistors coupling the plates of the first pair of tubes to the respective grids of the second pair, said capacitor coupling the grids of the second pair, and a resistor shunting said capacitor.

References Cited in the file of this patent

UNITED STATES PATENTS

| | | |
|---|---|---|
| 2,143,093 | Smith | Jan. 10, 1939 |
| 2,300,999 | Williams | Nov. 3, 1942 |
| 2,462,263 | Haynes | Feb. 22, 1949 |
| 2,557,691 | Rieber | June 19, 1951 |
| 2,604,528 | Obermaier | July 22, 1952 |
| 2,713,134 | Eckweiler | July 12, 1955 |